(12) United States Patent
Takei et al.

(10) Patent No.: US 7,902,750 B2
(45) Date of Patent: Mar. 8, 2011

(54) ELECTRO-OPTICAL DEVICE, ELECTRONIC APPARATUS, AND METHOD OF MANUFACTURING THE SAME

(75) Inventors: Shuichi Takei, Shimosuwa-machi (JP); Yuji Chino, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 286 days.

(21) Appl. No.: 11/846,090

(22) Filed: Aug. 28, 2007

(65) Prior Publication Data

US 2008/0067506 A1 Mar. 20, 2008

(30) Foreign Application Priority Data

Sep. 14, 2006 (JP) .................................. 2006-249409
Nov. 14, 2006 (JP) .................................. 2006-307543

(51) Int. Cl.
*H01L 51/50* (2006.01)
(52) U.S. Cl. ......................................................... 313/506
(58) Field of Classification Search .............. 445/24–25; 313/503, 504, 506; 427/66
See application file for complete search history.

(56) References Cited

U.S. PATENT DOCUMENTS

| | | | |
|---|---|---|---|
| 6,583,584 B2 | 6/2003 | Duineveld et al. | |
| 7,132,796 B2 | 11/2006 | Lee et al. | |
| 7,245,080 B2 | 7/2007 | Lee et al. | |
| 2005/0112341 A1* | 5/2005 | Ito et al. | 428/209 |
| 2005/0179373 A1* | 8/2005 | Kobayashi | 313/506 |
| 2005/0212728 A1* | 9/2005 | Miller et al. | 345/76 |
| 2006/0176413 A1* | 8/2006 | Moriya | 349/42 |
| 2006/0220532 A1* | 10/2006 | Tanabe et al. | 313/503 |
| 2006/0220543 A1* | 10/2006 | Makiura | 313/506 |
| 2006/0255735 A1* | 11/2006 | Moriya et al. | 313/610 |
| 2007/0046199 A1* | 3/2007 | Lee et al. | 313/512 |

FOREIGN PATENT DOCUMENTS

| | | |
|---|---|---|
| JP | A 2002-372921 | 12/2002 |
| JP | A-2004-527088 | 9/2004 |
| JP | A-2005-197228 | 7/2005 |
| JP | A-2008-4290 | 1/2008 |

OTHER PUBLICATIONS

Hayase S. Polysilanes for semiconductor fabrication. Prog. Polym. Sci. 28 (2003) 359-281.*

* cited by examiner

*Primary Examiner* — Toan Ton
*Assistant Examiner* — Hana S Featherly
(74) *Attorney, Agent, or Firm* — Oliff & Berridge, PLC

(57) ABSTRACT

An electro-optical device includes a substrate having a plurality of pixel electrodes thereon, a bank structure formed on the substrate and provided with a plurality of pixel apertures corresponding to the plurality of pixel electrodes, an injection layer formed in each of the plurality of pixel apertures for injecting electrons or holes, an organic semiconductor layer formed on the injection layer in each of a plurality of pixel apertures; and an electrode formed on the organic semiconductor layer, wherein the individual bank includes a lyophilic layer formed on the substrate and a lyophobic layer formed on the lyophilic layer. Here, each of the plurality of the pixel apertures is formed so as to penetrate the lyophilic layer and the lyophobic layer.

7 Claims, 9 Drawing Sheets

ELECTRO-OPTICAL DEVICE, ELECTRONIC APPARATUS, AND METHOD OF MANUFACTURING THE SAME

BACKGROUND

1. Technical Field

The present invention relates to an electro-optical device in which optical characteristics change according to electrical operations, an electronic apparatus and a method of manufacturing the same.

2. Related Art

An organic Electro Luminescent (EL) panel is an exemplary electro-optical device. In an organic EL panel, a plurality of organic EL elements serving as light-emitting elements having optical characteristics which change according to the magnitude of electric energy is arranged on a substrate. The organic EL panel is generally used as an optical head or an image display device.

FIGS. 8 to 10 show a structure of part of a known EL panel C. FIG. 8 is a plan view, FIG. 9 is a sectional view taken along line Z2-Z2' in the organic EL panel C shown in FIG. 8, and FIG. 10 is a perspective sectional view illustrating a portion N of the organic EL panel C.

To form light-emitting elements in the organic EL panel C, a hole injection layer and a light-emitting layer (organic semiconductor layer) are sequentially stacked in the apertures Q. The hole injection layer is made of a water-based solution but the light-emitting layer is made of an organic solution. For this reason, the material solution for the hole injection layer permeates into the inner circumferential surface of the first layer 220 and the material solution for the light-emitting layer permeates into the inner circumferential surface of the second layer 230. Subsequently, an electrode is formed on the light-emitting layer. This electrode is shared by all of the light-emitting elements. The light-emitting elements formed through the above-mentioned processes are sealed by a sealing layer. JP-A-2002-372921 discloses a structure of a known organic EL panel C which is almost the same as that described above.

However, the second layer 230 having a lyophobic property is made of an organic material such as acryl, polyimide or the like. Accordingly, the second layer 230 is apt to absorb moisture. For example, when the organic EL panel is manufactured, moisture can easily collect on the second layer 230 and stays on the surface of the second layer 230. The second layer 230 overlaps the pixel electrodes 210 and regions of the substrate 200 in which the pixel electrodes 210 are not disposed. That is, of the lower surface of the electrode provided on the light-emitting layer, a large area is in contact with the surface of the second layer 230. Accordingly, the organic EL panel C has a problem in that the electrode disposed on the light-emitting layer is easily oxidized.

Further, part of the second layer 230 is not covered by the electrode disposed on the light-emitting layer. Accordingly, when the sealing layer is formed by a film formation method using an inorganic material (thin film sealing), part of the sealing layer comes in contact with the second layer 230. In the contact region, the moisture on the surface of the second layer 230 prevents an inorganic material film from being formed. That is, a material for forming the second layer 230 (for example, acryl) is altered by hydration and thus expands in volume, so that the brittle sealing layer breaks. Accordingly, it is difficult to form the sealing layer on the organic EL panel C by the film formation method.

SUMMARY

An advantage of some aspects of the invention is that it provides an electro-optical device, an electronic apparatus and a method of manufacturing the same, which are capable of suppressing oxidation of an electrode formed on an organic semiconductor layer and facilitating formation of a sealing layer by a thin film formation method.

According to one aspect of the invention, there is provided an electro-optical device including a substrate having a plurality of pixel electrodes thereon, a bank structure provided with a plurality of pixel apertures corresponding to the plurality of pixel electrodes. Inside each pixel aperture is provided an injection layer for injecting holes or electrons, an organic semiconductor layer formed on the injection layer, and an electrode formed on the organic semiconductor layer. The bank structure includes a lyophilic layer formed on the substrate and a lyophobic layer formed on the lyophilic layer. The plurality of pixel apertures each is formed penetrating through the lyophilic layer and the lyophobic layer which has a weaker affinity for a material liquid used for forming the injection layer in comparison with the lyophilic layer and is constituted by a plurality of lyophobic portions corresponding to the plurality of pixel apertures. The plurality of lyophobic portions is spaced apart from each other, and each lyophobic portion is provided so as to surround the corresponding pixel aperture.

The injection layer functions to inject holes or electrons into the organic semiconductor layer. The organic semiconductor layer serves as a site in which holes and electrons recombines with each other. The organic semiconductor layer is made of an organic material and has a function of emitting light with a luminance corresponding to the amount of holes or electrons injected from the injection layer. An example of the electro-optical device is an organic EL element and an example of a light-emitting layer of the organic EL element is the organic semiconductor layer. The lyophilic layer is present on an inner circumferential surface of each pixel aperture, and the lyophilic layer has a stronger affinity for a material liquid used for forming the injection layer in comparison with the lyophobic layer. Accordingly, the material liquid permeates into and spread over the inner circumferential surfaces of the pixel apertures. The lyophilic layer is made of, for example, an inorganic material. The inorganic material includes silicon oxides, silicon nitrides, and silicon oxynitrides. The lyophobic layer must have a weaker affinity for the material liquid for the injection layer in comparison with the lyophilic layer, so that the lyophobic layer is made of an organic material, such as acryl, polyimide or the like which is apt to attract moisture. Further, since the organic semiconductor layer is made of an organic material, it is undesirable to etch the electrode formed on the organic semiconductor layer, for example, by a plasma dry etching. Accordingly, the electrode on the organic semiconductor layer is disposed over all of the plurality of pixel apertures, that is, the electrode covers all of the plurality of pixel apertures.

In the electro-optical device, it is preferable that the plurality of lyophobic portions surrounding the corresponding plurality of pixel apertures are spaced apart from each other, and the lyophobic layer is constituted by only the plurality of lyophobic portions. That is, the lyophilic layer is exposed to the electrode disposed on the organic semiconductor layer at positions where the electrode does not overlap either of the lyophobic portions and the pixel apertures. Accordingly, of a lower face of the electrode disposed on the organic semiconductor layer, an area that is in contact with the lyophobic layer which is apt to attract moisture is relatively small. That is, an area that is in contact with the lyophilic layer which scarcely attracts moisture is relatively large. Thus, thanks to the above-mentioned structure, it is possible to suppress oxidation of the electrode on the organic semiconductor layer and the sealing layer can be easily formed by a thin film formation method. Further, since it is possible to decrease amount of an organic material used for forming the lyophobic layer, and prolong the lifespan of the electro-optical device.

In the electro-optical device, all of the pixel apertures may have the same shape or have different shapes. An example of the latter is a full color display device in which shapes of ideal pixel apertures (an area of a pixel electrode in each pixel aperture) are different according to colors. In the display device, it is desirable that the shapes of the pixel apertures be different for colors of emitted light. This point can be applied to an electro-optical device having two or more pixels having ideal pixel aperture shapes different from each other. Accordingly, in the electro-optical device, the plurality of pixel apertures may include two or more pixel apertures having different shapes from each other. According to this aspect, since the inner diameter of one or more lyophobic portions is smaller than that of the other lyophobic portions, a contact area between a lower surface of the electrode formed on the organic semiconductor layer and the lyophobic layer which is apt to attract moisture is relatively narrow in comparison with the structure in which all of the pixel apertures have the same shape.

However, if the lyophilic layer inwardly protruding from an inner surface of the pixel aperture, the injection layer comes to be also formed on the lyophilic layer as well as on the lyophobic layer. Accordingly, if the injection layer has low resistance, cross-talk in a direction of a diameter of the pixel aperture occurs, so that a light-emitting region of the corresponding pixel becomes larger than size of an ideal pixel aperture and expands so as to have a size the same as a diameter of the pixel aperture. Accordingly, it is preferable that the pixel aperture is formed in a manner such that apertures provided in the lyophilic layer and the lyophobic layer, respectively have the same shape. In this case, the lyophilic layer do not gush out into the pixel apertures, and thus the inner circumferential surfaces of the lyophilic layer and the lyophobic layer are in the same plane. As a result, light can be emitted from a pixel with an ideal pixel aperture and an area of a light-emitting region can be controlled. Thus, in the case in which the electro-optical device is used as an optical head, it is possible to enhance quality of a print. On the other hand, in the case in which the electro-optical device is used as a display device, it is possible to improve resolution of a display image. Still further, since the diameter of the inner circumference of each lyophobic portion becomes smaller in comparison with the case in which the lyophilic layer gushes out into the inside of toe pixel aperture. Accordingly, it is possible to decrease a contact area between the lower surface of the electrode on the organic semiconductor layer and the lyophobic layer which is apt to attract moisture.

In the electro-optical device, it is preferable that an interlayer layer is provided between the organic semiconductor and the inject on layer. The interlayer layer has a function of promoting injection of carriers (holes/electrons) from the injection layer to the organic semiconductor layer and blocking the carriers (holes/electrodes) from escaping from the organic semiconductor layer and is made of, for example, TFB. The interlayer layer has a thickness in a range from several nm to several tens ns. With this structure, it is possible to enhance luminance of the organic semiconductor layer and prolong lifespan of the electro-optical device.

According to another aspect of the invention, there is provided an electronic apparatus having the electro-optical device having any of the above structures. Accordingly, it is possible to obtain advantages attributable to the above-mentioned advantages.

According to further aspect of the invention, there is provided a method of manufacturing an electro-optical device having a plurality of pixel apertures. The method includes forming pixel electrodes on a substrate at regions corresponding to the pixel apertures, sequentially forming a lyophilic layer and a lyophobic thin film on the substrate so as to cover the pixel electrodes, processing the surface of the substrate so as to make ring-shaped regions of a surface of the lyophobic thin film have relatively strong affinity for a solution—in comparison with regions other than ring-shaped regions by applying energy to the ring-shaped regions surrounding the pixel apertures, forming a ring-shaped lyophobic layer at the ring-shaped regions of the surface of the substrate by a liquid droplet discharge method, removing the lyophobic thin film and the lyophilic layer formed at positions surrounded by the ring-shaped regions, sequentially forming an injection layer and an organic semiconductor layer in a lower position of depressions formed at the positions surrounded by the ring-shaped regions by a liquid droplet discharge method, and forming a negative electrode on the organic semiconductor layer.

In the method, it is preferable that ring-shaped lyophilic regions and lyophobic regions are distributed on the surface of the substrate after the processing the surface of the substrate. Thanks to this structure, liquid droplets permeates into and spread over the ring-shaped lyophilic regions when forming the lyophobic layer on the ring-shaped lyophilic regions by the liquid droplet discharge method but it is difficult for the liquid droplets to intrude into neighboring lyophobic regions. Accordingly, it is possible to easily form the lyophobic layer at the ring-shaped regions. Further, since liquid droplets containing lyophobic material are not discharged at regions other than the ring-shaped regions at the time of forming the lyophobic layer, it is possible to reduce usage of the lyophobic material to the minimum necessary. Therefore, it is possible to form the injection layer and the organic semiconductor layer in the depressions, each with a side wall served by the lyophobic layer. In a subsequent step, the negative electrode is stacked. Thus, of the lower surface of the negative electrode, a contact area between the lower surface of the negative electrode and the lyophobic layer which is apt to attract moisture is decreased. As a result, it is possible to suppress oxidation of the negative electrode and easily form a sealing layer when using a thin film sealing structure. Moreover, since it is possible to reduce the usage of an organic material used for forming the lyophobic layer, lifespan of the electro-optical device can be prolonged. In this aspect, the phrase "surface of a substrate" means the outermost surface of components stacked on the substrate, and the phrase "liquid droplet discharge method" means a method of forming a functional material layer by discharging liquid droplets of a functional liquid in which a functional material such as organic semiconductor is dispersed or dissolved in a solution and evaporating a solvent in the discharged functional liquid by drying. The liquid droplet discharge method includes an inkjet method and a dispenser coating method.

In the method of manufacturing an electro-optical device, it is preferable that the lyophobic thin film is a monomolecular film. It is further preferable that the processing the surface of the substrate is performed by arranging a mask on the monomolecular film at the regions other than the ring-shaped regions and removing the monomolecular layer formed at the ring-shaped regions by irradiating ultraviolet rays to the surface of the substrate. Moreover, it is preferable that the monomolecular film contains a coupling agent. Since the coupling agent has a property of being decomposed by ultraviolet rays, it is possible to form a predetermined pattern of the monomolecular film by selectively irradiating ultraviolet rays to the monomolecular film formed over the entire surface of the substrate. In the above method, after the processing the surface of the substrate, the lyophilic layer is exposed at the ring-shaped regions and the monomolecular film having a lyophobic property remains at the regions other than the ring-shaped regions. Accordingly, it is possible to easily form the lyophobic layer at the ring-shaped regions by the liquid droplet discharge method.

In the method of manufacturing an electro-optical device, it is preferable that the processing the surface of the substrate is performed by arranging a mask at the regions other than the ring-shaped regions of the surface of the lyophobic thin film, and processing the surface of the substrate by plasma treatment. According to this method, after the processing the surface, the surface of the lyophobic thin film comes to have increased lyophilicity at the ring-shaped regions but maintains the lyophobicity at the other regions. Thus, it is possible to easily form the lyophobic layer at the ring-shaped region by the liquid droplet discharge method.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described with reference to the accompanying drawings. Scales of the drawings are different from the real scale and are set to appropriate ratios.

First Embodiment

Figure 1:
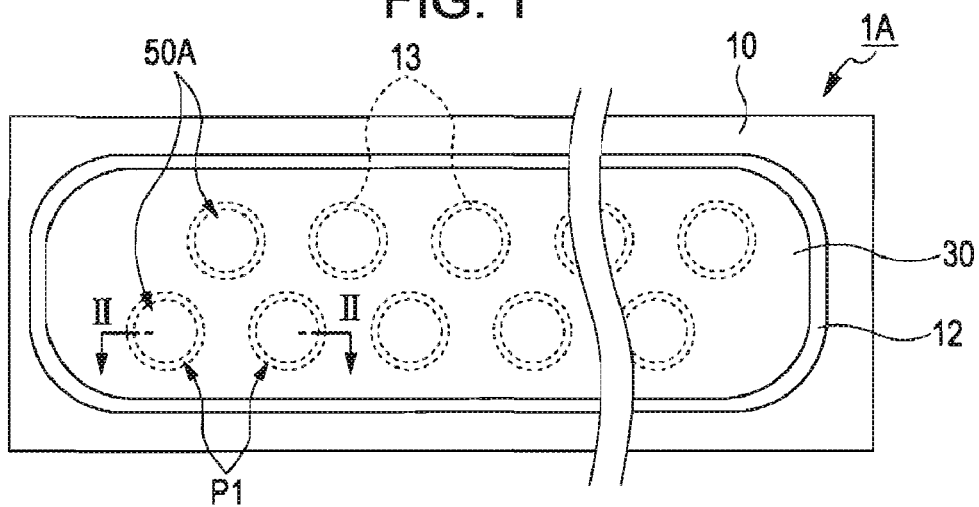
FIG. 1 is a plan view illustrating an optical head 1A according to a first embodiment.
Figure 2:
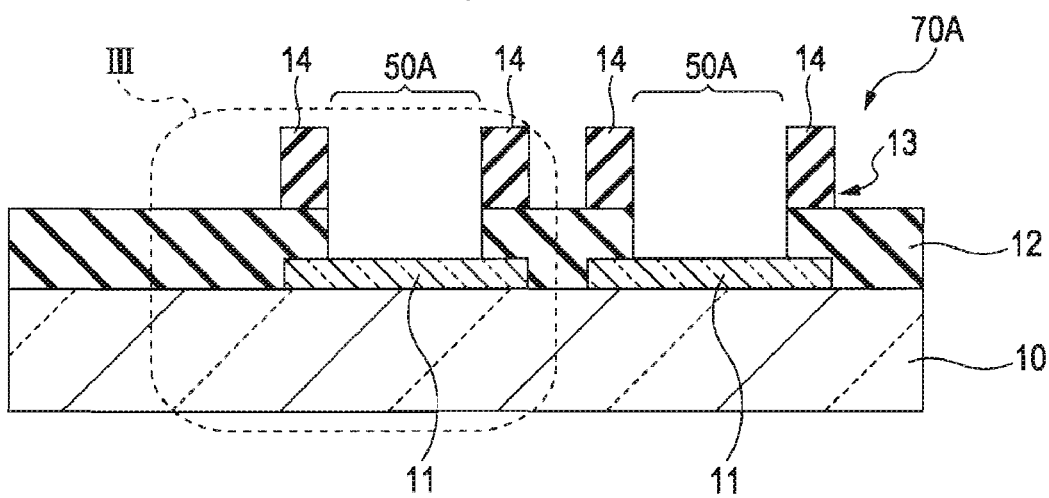
FIG. 2 is a sectional view illustrating a section of the optical head 1 shown in FIG. 1, which is taken along one Z1-Z1'.
Figure 3:
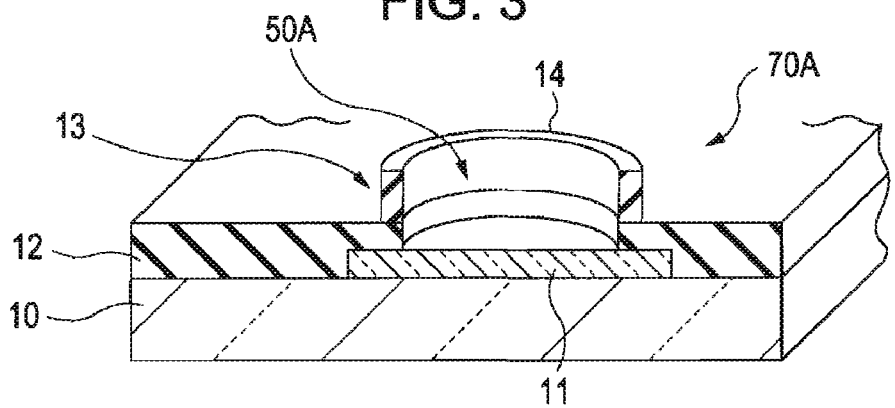
FIG. 3 is a perspective sectional view illustrating part M of the optical head 1 shown in FIG. 2.

FIG. 1 shows a plan view of a structure of an electro-optical device according to a first embodiment of the invention. The electro-optical device according to this embodiment relates to an optical head 1A which forms a latent image on an image carrier, such as a photoconductor drum, and is provided in an electrophotographic image forming apparatus. FIG. 2 shows a section of the optical head 1, taken along line Z1-Z1' shown in FIG. 1. FIG. 3 perspectively shows a section of part M of the optical head 1 shown in FIG. 2. Although FIGS. 2 and 3 do not illustrate a hole injection layer 20, an interlayer layer 21, a light-emitting layer and a negative electrode 30, the optical head 1A includes those elements.

In the optical head 1A, a plurality of light-emitting elements P1 are arranged in two off-set rows on a substrate 10. Each light-emitting element P1 has a pixel aperture 50A in which the hole injection layer 20, the interlayer layer 21, and the light-emitting layer 22 (shown in FIG. 4D) are provided. The diameter of each pixel aperture 50A is 40 µm. The pixel apertures 50A are arranged at a pitch of 84.5 µm in a lengthwise direction of the optical head 1A in two off-set columns. A pitch of the columns is also 84.5 µm. Accordingly, it is possible to realize resolution of 600 dpi. Alternatively, the light-emitting elements P1 can be arranged in four columns or 8 columns so as to realize higher resolution of 1200 dpi or 2400 dpi.

According to circumstances, a driving circuit including wirings, driving thin film transistors (TFTs), and an interlayer insulation film is provided on the substrate 10. Transparent positive electrodes 11 made of indium tin oxide (ITO) are formed on the substrate 10. The positive electrodes 11 are connected to the driving circuit through a contact hole penetrating through the interlayer insulation film and serve as pixel electrodes (not shown).

A lyophilic layer (lyophilic insulation layer) 12 is stacked on the positive electrodes 11 and the substrate 10. The lyophilic layer 12 is preferably made of an inorganic material, such as a silicon oxide, a silicon nitride or a silicon oxynitride. The lyophilic layer 12 has a property that a water-based solution can permeate thereinto. The lyophilic layer 12 has a thickness almost the same as or larger than that of the hole injection layer 20 and is more particularly set in a range from 50 to 200 nm. If the lyophilic layer 12 is thicker than 200 nm, various problems are caused in that a film formation period becomes longer, precision of an etching process is deteriorated and it is difficult to form the light-emitting layer 22 to have uniform thickness in all pixels.

The lyophobic layer 13 (lyophobic insulation layer) is stacked on the lyophilic layer 12 and is provided with apertures having the same shape as those of the lyophilic layer 12. The apertures of the lyophobic layer 13 and the apertures of the lyophilic layer 12 are connected to each other. The lyophilic layer 12 and the lyophobic layer 13 demarcate the pixel apertures 50A, a number of which is the same as that of the light-emitting elements P1. That is, the lyophilic layer 12 and the lyophobic layer 13 serve as the bank structure 70A for demarcating pixel apertures corresponding to light-emitting elements P1. The shapes of the apertures of the lyophilic layer 12 and the lyophobic layer 13 are the same as each other. The same shape means not only substantially the same shape where the apertures perfectly overlap each other in a plan view but also almost exactly the same shape where the apertures are slightly misaligned due to manufacturing errors. A number of the apertures is the same as a number of the positive electrodes 11.

The lyophobic layer 13 is constituted by only lyophobic portions 14, a number of which is the same as a number of the positive electrodes 11 and does not include any other elements. The lyophobic portions 14 each have a cylindrical shape and each surround a corresponding pixel aperture 50A, and walls of the lyophobic portions 14 are the same in thickness. The thickness of the wall of the lyophobic portion 14 is, for example, not larger than 20 µm. Accordingly, the lyophobic portions 14 are made separate from each other.

The lyophobic layer 13 is made of a lyophobic material, for example a resin based on an organic material, such as photosensitive acryl and polyimide. The lyophobic layer 13 has a property of repelling a water-based solution but allowing an organic solvent to permeate thereinto. The thickness (height) of the lyophobic layer 13 is in a range from 0.1 to 2.5 µm. A problem is encountered with a lyophobic layer thinner than 0.1 µm in that liquid deposited on a target substrate by an ink jet method overflows so that variation in thickness of the lyophobic layer is too large to be in an allowable range of the target thickness and thus it is impossible to ensure dimensional precision of the apertures. Conversely, if the lyophobic layer is thicker than 2.5 µm, uniformity in thickness of the light-emitting layer 22 formed in a subsequent process is deteriorated.

In each pixel aperture 50A, the hole injection layer 20 is formed on the positive electrode 11, the interlayer layer 211 is formed on the hole injection layer 20; and the light-emitting layer 22 made of an organic EL material is formed on the interlayer layer 21. An appropriate material for the hole injection layer 20 may be PEDOT-PSS which is a kind of conductive polymer. The interlayer layer 21 has functions of promoting injection of holes from the injection layer 20 to the light-emitting layer 22 and stopping electrons from escaping from the light-emitting layer 22. The interlayer layer 21 is made of, for example FTB(poly(2,7-(9,9-di-n -octylfluorene)-alt-(1,4-phenylene-((4-sec -butylphenyl)imino)-1,4-phenylene)).

A negative electrode 30 is formed on the bank structure 70A and the light-emitting layer 22. The light-emitting element P1 is constituted by the positive electrode 11, the hole injection layer 20, the light-emitting layer 22 and the negative electrode 30. The negative electrode 30 is an electrode shared by all of the light-emitting elements P1 and is made of, for example calcium. The negative electrode 30 may include either or both of an electron injection layer and an electron transport layer.

Even though not shown in the figures, the light-emitting elements P1 of the optical head 1A are sealed so as to be protected from ambient air. There are a variety of sealing structures for the light-emitting element, but a thin film sealing structure is used in this embodiment. In addition to the thin film sealing structure, a can sealing structure with a gap filled with gas which is disposed under a sealing layer and a substrate sealing structure with no gap filled with gas can be alternatively used.

Figure 4A:
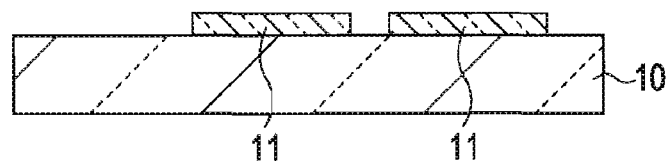
FIGS. 4A to 4F are sectional views illustrating process steps in a manufacturing method of the optical head 1.

FIGS. 4A to 4F shows process steps of a manufacturing method of the optical head 1A. First, as shown in FIG. 4A, positive electrodes 11 are formed on a substrate 10 at predetermined regions. The positive electrodes 11 are formed by patterning an ITO film.

Figure 4B:
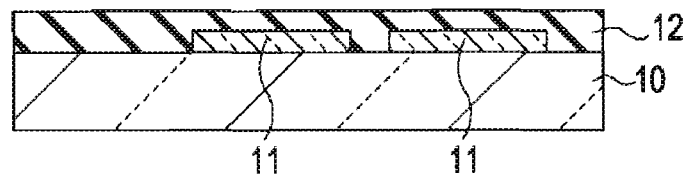

Next, as shown in FIG. 4B, a film formation process is performed in order to form a lyophilic layer 12. Desirable materials for the lyophilic layer 12 include silicon oxides, silicon nitrides, and silicon oxynitrides but are not limited thereto. That is, an insulating material which can be easily formed into a film and etched may be used. The film formation may be performed by any of known methods and not be limited to any particular method. For example, the film formation may be performed by a spin coating method, a spray coating method, a roller coating method, a die coating method, a dip coating method, or the like. An ideal thickness of the lyophilic layer 12 is in a range from 50 to 200 nm. If the thickness of the lyophilic layer is larger than the upper thickness boundary of the range, a time that it takes to form a film is increased, precision of an etching process is deteriorated, and it is difficult to form the light-emitting layer 22 so as to have a uniform thickness in every pixel.

Figure 4C:
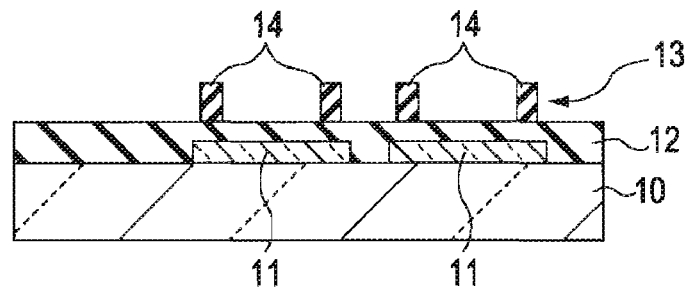

Next, as shown in FIG. 4C, a lyophobic layer 13 is formed on the lyophilic layer 12 using an organic material, such as acryl, polyimide, or the like. The lyophobic layer 13 may be formed by using any of known methods, such as a printing method, a lithography process, or the like. In the case of forming the lyophobic layer 13 by the printing method, an organic material is directly coated to form a bank structure by any of intaglio printing, planography, and astatic printing. On the other hand, in the case of using the lithography process, an organic film is first formed using a photosensitive organic material and then patterned by being exposed to light. The lyophobic layer 13 has a thickness in a range from 0.1 to 2.5 µm.

Figure 4D:
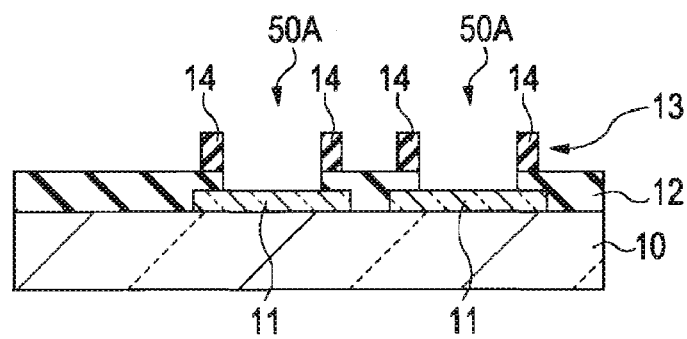

Next, as shorn in FIG. 4D, pixel apertures 50A are formed. In this process step, the lyophilic layer 12 is etched using the lyophobic layer 13 as an etching mask. The lyophobic layer 13 can be used as a resist for etching because it is made of an organic material. Accordingly, it is possible to selectively etch off only the lyophilic layer 12 by carefully selecting an etching material. Even though either of dry etching using no solution and wet etching using a solution may be used for the etching process, dry etching is preferable because it negligibly generates undercutting. In more detail, it is preferable that the etching is performed by plasma etching. Apertures having the same shape as those formed in the lyophobic layer 13 can be formed in the lyophilic layer 12 by plasma etching. Subsequently, a nitrification process is performed by oxygen plasma treatment and solution-repellent processing is performed by $F_4$ plasma treatment. Thanks to such treatments, the surfaces of the positive electrodes 11 have a property of lyophilicity and the surface of the lyophobic layer 13 has a property of lyophobicity. That is, the surfaces of the lyophilic layer 12 and the positive electrodes 11 have stronger affinity for water-based solutions in comparison with the lyophobic layer 13.

Figure 4E:
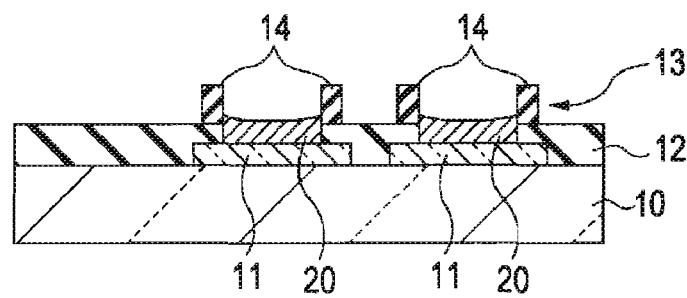

Next, as shown in FIG. 4E, a hole injection material solution is implanted into the pixel apertures 50A by an ink-jet method and dried so as to form the hole injection layer 20. In the case in which the hole injection material solution is PEDOT-PSS using an water-based solvent, the hole injection layer 20 is formed only inside the pixel apertures 50A because the hole injection material solution is repelled by the lyophobic layer 13. Further, since the lyophilic layer 12 is formed on the inner surfaces of the pixel apertures 50A and exposed through the pixel apertures 50A, the hole injection material solution can easily permeate into and spread over the entire area in the pixel apertures 50A, resulting in a decrease in occurrences of defectives in the hole injection layer 20.

Figure 4F:
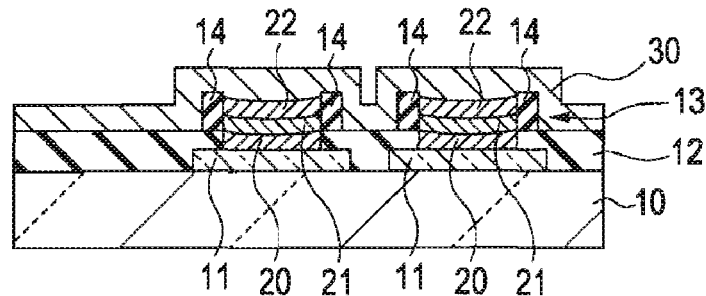

After that, the interlayer layer 21 and the light-emitting layer 22 are sequentially formed by repeating a process of implanting an organic solution, such as a light-emitting material solution into the pixel apertures 50A by an ink jet method and drying the organic solution. In this procedure, each organic solution used for forming the interlayer layer 21 and the light-emitting layer 22 somewhat permeates into and spreads over the surface of the lyophobic layer 13. Then, as shown in FIG. 4F, a negative electrode 30 is formed by depositing calcium and aluminum (Ca/Al). Finally, a thin film sealing process is performed. That is, an inorganic material, such as a silicon oxide, a silicon nitride, or a silicon oxynitride is deposited so as to form a sealing layer (not shown) which covers all of the light-emitting elements P1.

As described above, according to this embodiment, each pixel aperture 50A is surrounded by the corresponding lyophobic portion 14, and the lyophobic portions 14 corresponding to the pixel apertures 50A are spaced apart from each other. Further, the lyophobic layer 13 is constituted only by the lyophobic portions 14. That is, a region of the negative electrode 30, which does not overlap the lyophobic portions 14 and the pixel apertures 50A, is exposed to the lyophilic layer 12. Accordingly, an area of the lower surface of the negative electrode 30, which is in contact with the lyophobic layer 13 which is apt to absorb moisture, is decreased. Conversely, an area of the lower surface of the negative electrode 30, which is in contact with the lyophilic layer 12 which negligibly absorbs moisture, is increased. For this reason, oxidation of the negative electrode 30 in the optical head 1A is suppressed.

Further, according to this embodiment, of a lower surface of the sealing layer, an area that is in contact with the lyophobic layer 13 which is apt to absorb moisture is decreased. Conversely, an area that is in contact with the lyophilic layer 12 which negligibly absorbs moisture is increased. In greater detail, as shown in FIG. 4F, the sealing layer made of an inorganic material is not in contact with the lyophobic layer 13 made of an organic material. Accordingly, film formation for the sealing layer is not hindered. Thus, in the optical head 1A, the sealing layer (thin film) can be easily formed in the case in which the optical head is sealed in a thin film sealing structure. Further, usage of an organic material for the lyophobic layer 13 can be reduced. That is, it is possible to reduce amount of water in a sealed space. As a result, the lifespan of the optical head 1A is prolonged.

Figure 5:
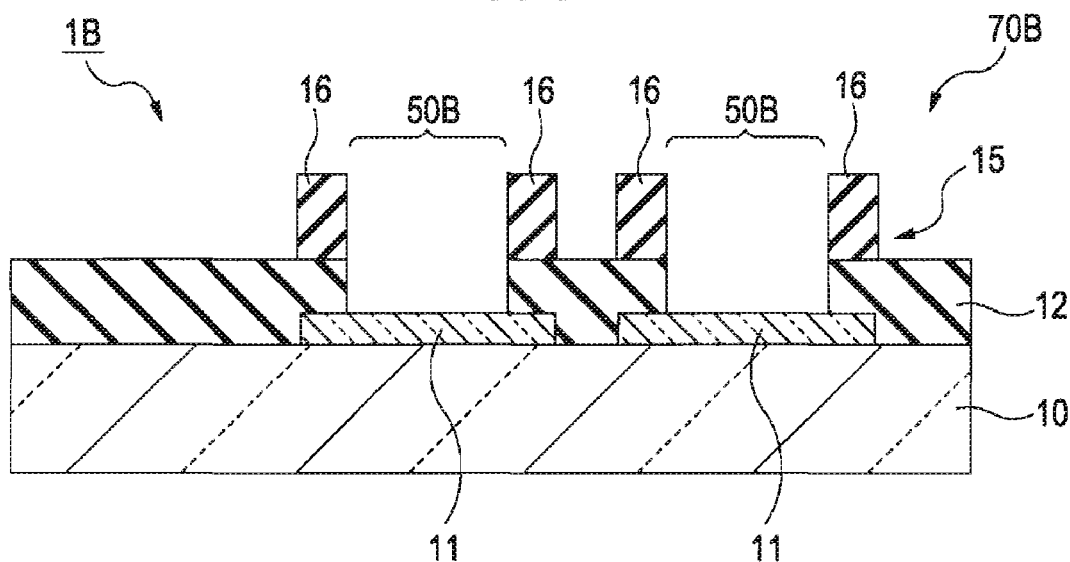
FIG. 5 is a sectional view illustrating part of an optical head 1B according to a modification example of the first embodiment.

FIG. 5 shows a section of part of an optical head 1B obtained by the method according to the above embodiment. In the optical, head 1B, a lyophobic layer 15 is formed in a manner such that the lyophilic layer 12 inwardly protrudes from an inner surface of a lyophobic portion 16 in each pixel aperture 50B. The lyophobic layer 15 is constituted by a plurality of lyophobic portions 16 which are provided in the same number of positive electrodes 11 like the lyophobic layer 13 as in the optical head 1A. It is also possible to achieve the above-mentioned advantages by the optical head 1B. However, the optical head 1B is different from the optical head 1A in that the hole injection layer 20 is present on the lyophilic layer 12. Thanks to this structure, in the case in which the hole injection layer 20 serves as a resistor, crosstalk in a diameter direction of the pixel aperture 50B occurs and a light-emitting region which is an upper surface area of the positive electrode 11 in the pixel aperture 50B (ideal pixel aperture) which corresponds to an area of a lower position of the pixel aperture FOB expands to a boundary of the pixel aperture SOB which is defined by ends of the diameter of the pixel aperture 50B. On the other hand, in the optical head 1A, since the apertures of the lyophilic layer 12 and the lyophoabic layer 13 have the same shape, the inner surfaces of the lyophilic layer 12 and the lyophobic layer 13 lie in the same plane. Accordingly, the optical head 1A can emit light from the light-emitting area corresponding to the ideal pixel aperture. Thus, the optical head 1A can improve image quality of an image forming apparatus when the optical head 1A is used in the image forming apparatus. Moreover, since an inner diameter of each lyophobic portion 14 of the optical head 1A is relatively small in comparison with the optical head 1B, it is possible to decrease a contact area between the lower surface of the negative electrode 30 and the lyophobic layer 13 which is apt to absorb moisture.

Second Embodiment

Figure 11:
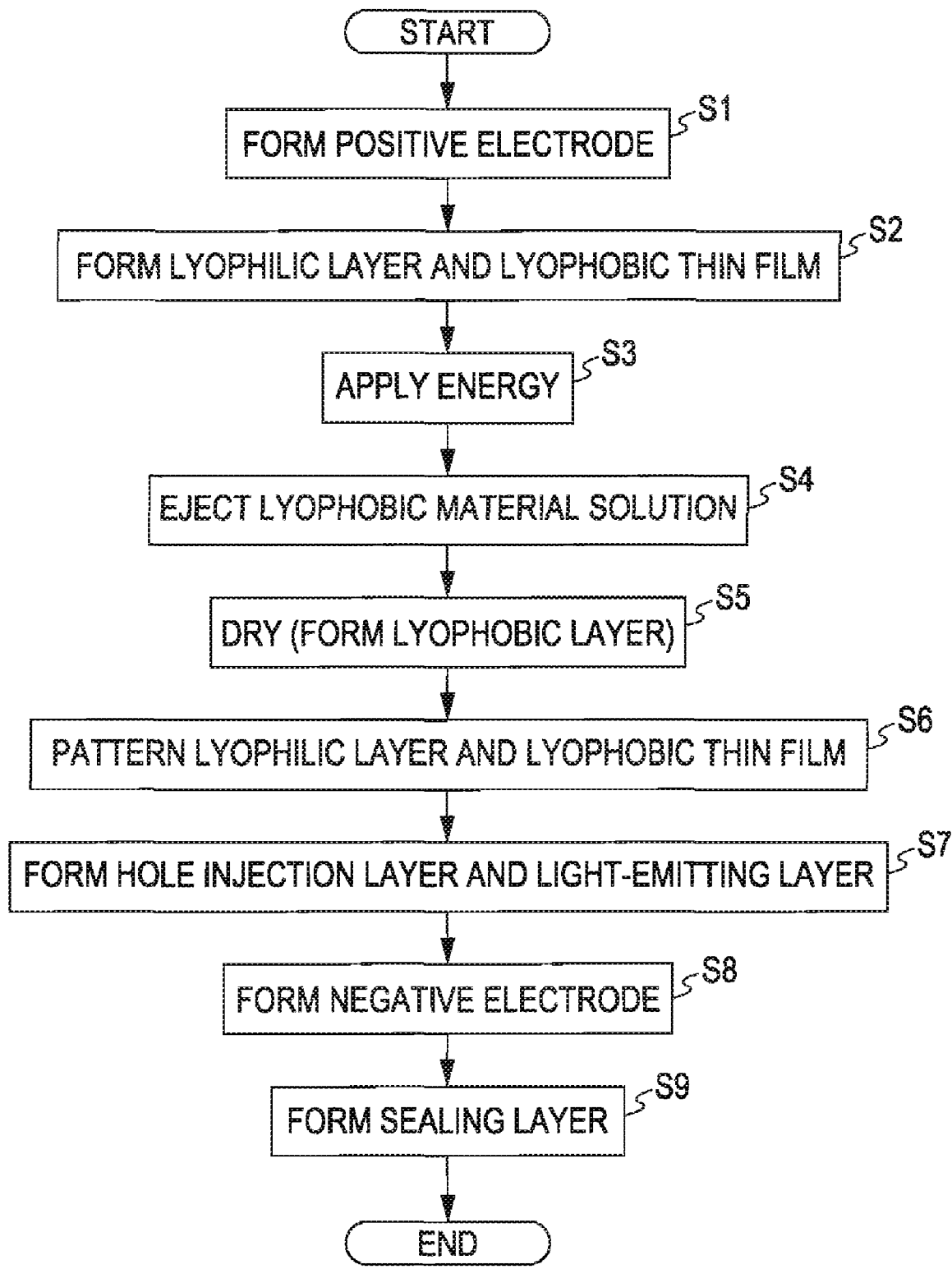
FIG. 11 is a flowchart showing a method of manufacturing an optical head 1D.

Hereinafter, an optical head 1D according to a second embodiment of the invention will be described. A structure of the optical head 1D which is shown in FIG. 13C is basically the same as a structure of the optical head 1A (shown in FIG. 4F) according to the first embodiment. However, the optical head 1D according to the second embodiment is different from the optical head 1A in that a lyophobic thin film 18 is formed on the lyophilic layer 12 and the lyophobic layer 13 is formed by an ink jet method. Hereinafter, a, manufacturing method of the optical head 1D will be described focusing on aspects that are different from the optical head 1A with reference to FIGS. 11, 12A to 12D, 13A to 13C and 14A to 14D. FIG. 11 is a flow chart showing a manufacturing method of the optical head 1D, FIGS. 12A to 12D and FIGS. 13A to 13C are sectional views illustrating the optical head 1D and showing process steps of the manufacturing method. FIGS. 14A to 14D are perspective views illustrating part of the optical head 1D and showing process steps of the manufacturing method of the optical head 1D. Like elements in the embodiment shove FIGS. 1 to 3 and 4A to 4F and this embodiment are referenced by like reference numerals. Accordingly, explanation of the like elements will be omitted.

Figure 13A:
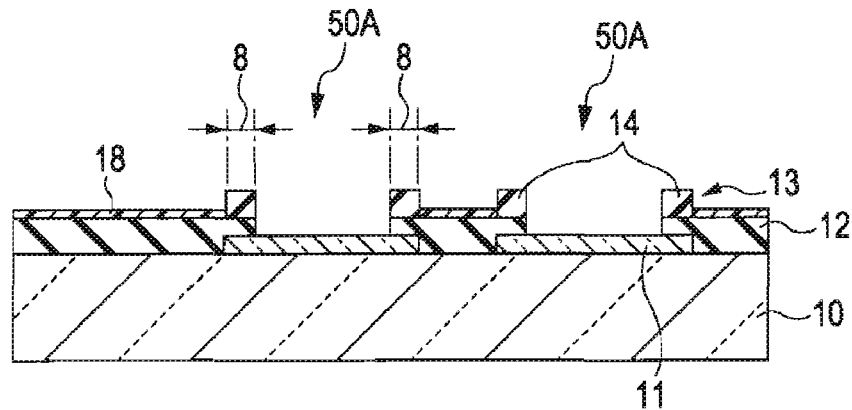
FIGS. 13A to 13C are sectional views illustrating process steps of a manufacturing method of the optical head 1D.

First, as shown in FIG. 13A, positive electrodes 11 serving as pixel electrodes and made of ITO are formed on a substrate 10 having driving TFTs thereon at positions corresponding to pixel apertures 50A (FIG. 13A) at Step S1.

Figure 12A:
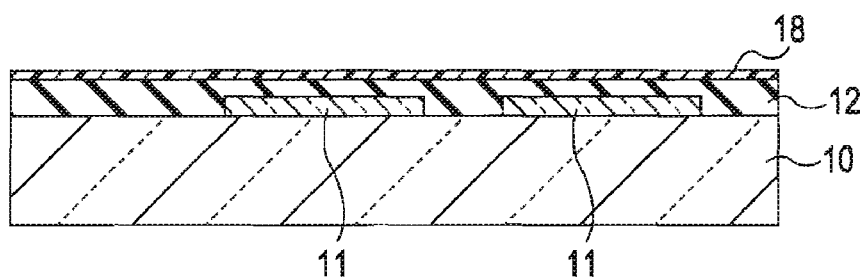
FIGS. 12A to 12D are sectional views illustrating process steps of a manufacturing method of the optical head 1D.

Next, as shown in FIG. 12A, a lyophilic layer 12 and a lyophobic thin film 18 are formed on the substrate 10 so as to cover the positive electrodes 11 at Step S12. In greater detail, to form the lyophilic layer 12, a film is formed over the entire surface of the substrate 10 so as to cover the positive electrodes 11 using a material containing any of silicon oxides, silicon nitrides and silicon oxynitrides by a low pressure chemical vapor deposition (LPCVD) method, a spin coating method, a spray coating method, a roller coating method, a die coating method and a dip coating method. Next, an alcohol solution containing 1% perfluoroalkyl-trimethoxy-silane is coated over the lyophilic layer 12 by a dipping method and then the lyophilic layer 12 is rinsed. Thus, a lyophobic thin film 18 is formed over the entire surface of the lyophilic layer 12. The lyophobic thin film 18 is a monomolecular layer formed using perfluoroalkyl-trimethoxy-silane as a material. It is preferable that the lyophobic thin film 18 is as thick as the diameter of one to two molecules). In this embodiment, a silane coupling agent is used, but the coupling agent is not limited thereto. Desirable coupling agents include a silane-coupling agent, a titan-coupling agent, a silane-based metal akylate coupling agent, and a fluorine-containing coupling agent having a lyophobic group, such as alkyl group, aryl group or aromatics replacing the alkyl group and aryl group. The term "lyophobic" of the lyophobic thin film 18 means "relatively strong repellency for a solution" in comparison with a material of at least the lyophilic layer 12.

Figure 12B:
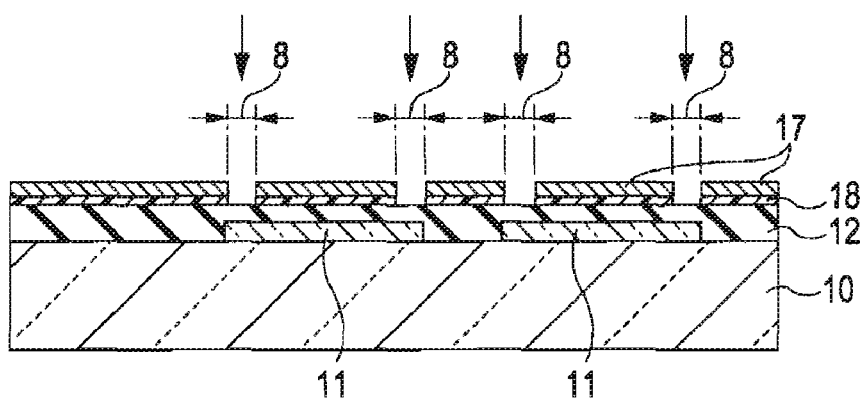
Figure 14A:
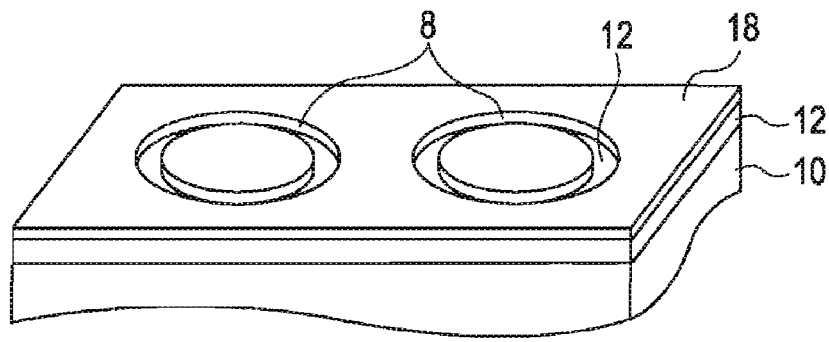
FIGS. 14A to 14D are perspective views of part of the optical head 1D for showing process steps of a manufacturing method of the optical head 1D.

Next, as shown in FIG. 12B, energy is applied to ring-shaped regions 8 surrounding pixel apertures 50A of the surface of the lyophobic thin film 18 at Step S3. In more detail, a mask 17 is put on the lyophobic thin film 18 so as to cover regions other than the ring-shaped regions 8 of the surface of the lyophobic thin film 18 and ultraviolet rays are irradiated onto the lyophobic thin film 18 via the mask 17. At this time, the lyophobic thin film 18 disposed on the ring-shaped regions 8 is exposed to the ultraviolet rays, so that the lyophobic thin film 18 (monomolecular film) at the ring-shaped regions 8 is decomposed and removed. As a result, as shown in FIG. 14A, the lyophilic layer 12 at the ring-shaped regions 8 is exposed. That is, the surface of the substrate 10 has lyophilic regions 8 each having a ring-shape and lyophobic regions surrounding the ring-shaped regions 8. In other words, the lyophilic layer 12 is exposed at the ring-shaped regions 8 of the surface of the substrate 10 and the lyophobic thin film 18 is exposed at the regions other than the ring-shaped regions 8 of the surface of the substrate 10. By Step S3, the ring-shaped regions 8 of the surface of the substrate 10 come to have relatively strong affinity for a solution in comparison with the regions other than the ring-shaped regions 8. Here for irradiation of ultraviolet rays, it is preferable that light with a wavelength of 245 nm from a low pressure mercury lamp is used. Step S3 corresponds to a step of processing a surface of a substrate in the invention.

Figure 12C:
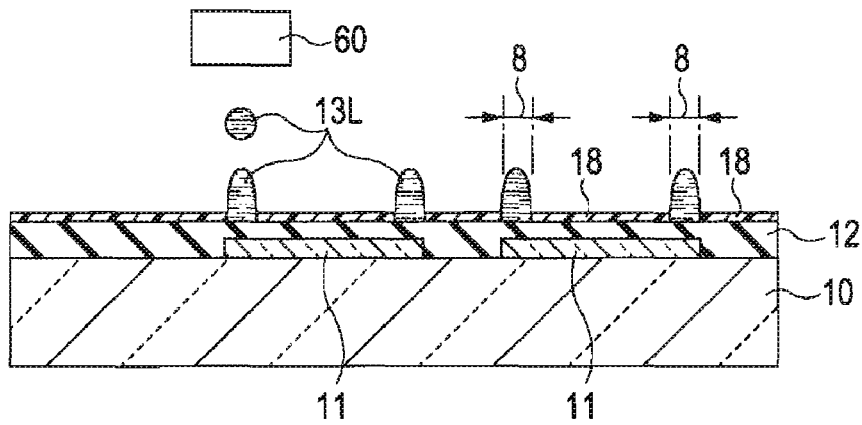

Next, a lyophobic material solution 13L containing a material for the lyophobic layer 13 (shown in FIG. 12D) is ejected by an ink jet method which is an example of a liquid droplet ejecting method onto the ring-shaped regions 8 of the surface of the substrate 10, at Step S4, as shown in FIG. 12C. In more detail, the lyophobic material solution 13L which is a solution prepared by decomposing or dispersing an organic material, such as acryl or polyimide into a solvent, such as ethylene glycol is ejected onto the ring-shaped regions 8 on the substrate 10) from an ink jet head 60. At this time, since the lyophilic layer 12 is present at the ring-shaped regions 8 to which the lyophobic material solution 13L is ejected and the lyophobic thin film 18 having a lyophobic property is formed at the regions other than the ring-shaped regions 8, the lyophobic material solution 13L only permeates into the ring-shaped regions 8 but negligibly intrudes into other regions. Accordingly, the lyophobic material solution 13L ejected from the ink jet head 6 is disposed so as to protrude from the surface of the substrate to a height of about several tens of μm in the ring-shaped regions 8, as shovel in FIG. 12C.

Figure 12D:
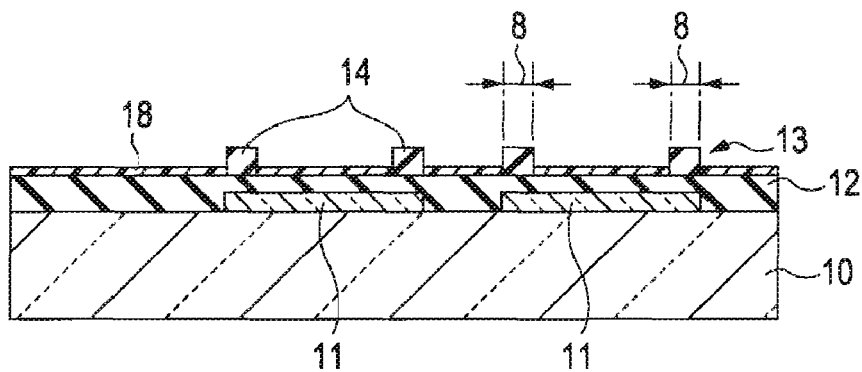
Figure 14B:
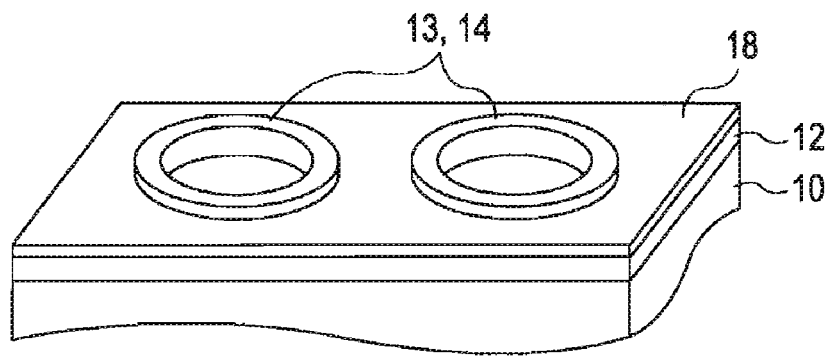

Next, at Step S5, the lyophobic material solution 13L, ejected onto the substrate 10 is dried so as to form the ring-shaped lyophobic layer 13 having lyophobic portions 14, as shown in FIG. 12D and FIG. 14B. In more detail, the lyophobic material solution 13L is dried or baked at a high temperature so that a solvent evaporates and an organic material contained in the lyophobic solution 13L is solidified. As a result, the lyophobic layer 13 is formed at the ring-shaped regions 8. The drying process used in Step S5 is performed by subjecting the substrate 11 intact to a condition of 200° C. for 10 minutes. During the drying process, the lyophobic material solution 13L negligibly spreads outside the ring-shaped regions 8 due to the presence of the lyophobic thin film 18. Accordingly, the lyophobic layer 13 can be easily formed at the ring-shaped regions 8.

Figure 14C:
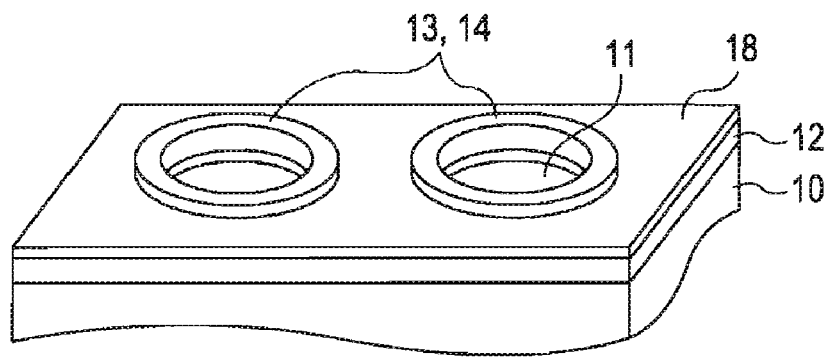

Next, at Step S6, the lyophobic thin film 18 and the lyophilic layer 12 formed at the regions surrounded by the ring-shaped regions 8 (the regions inside ring-shaped regions 33 are removed in order to perform patterning with respect to the lyophobic thin film 18 and the lyphilic layer 12, as shown in FIG. 13A and FIG. 14C. In more detail, a mask is formed on the substrate so as to cover the ring-shaped regions 8 and regions outside the ring-shaped regions 8 (the regions at which the lyophobic layer 13 is to be formed), and a dry etching process is performed to expose positive electrodes 11 by etching the lyophobic thin film 18 and the lyophilic layer 12 disposed inside the ring-shaped regions 8 off. After that, the mask is removed and thus step S6 is finished. By Step S6, depressions, each being defined by the positive electrode 11 serving as a lower end of the depression and the lyophilic layer 12 and the lyophobic layer 13 providing side walls of the depression, are formed inside the ring-shaped regions 8. The depressions correspond to pixel apertures 50A and are regions to receive a hole injection layer 20 and a light-emitting layer 22 thereon at Step S7.

Figure 13B:
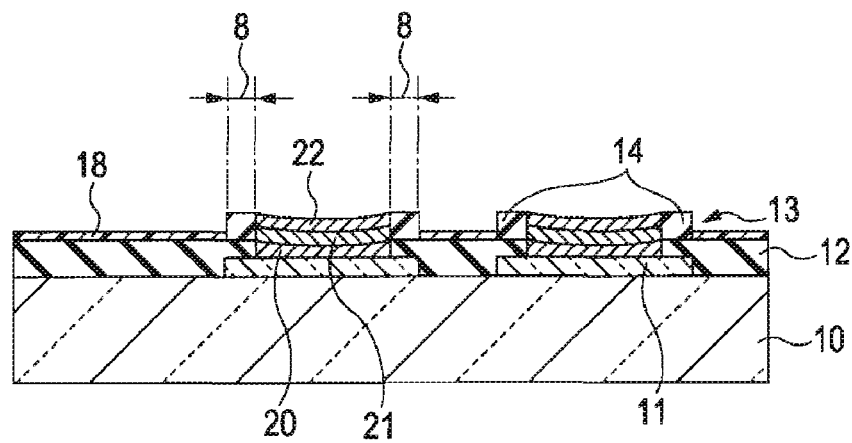
Figure 13C:
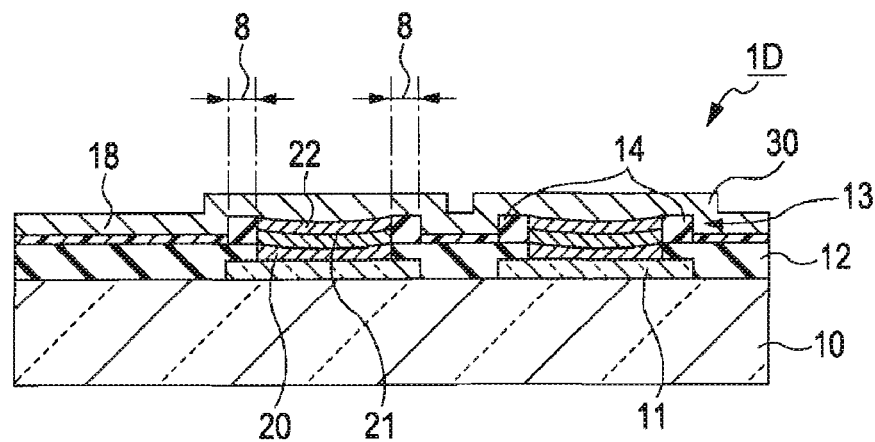
Figure 14D:
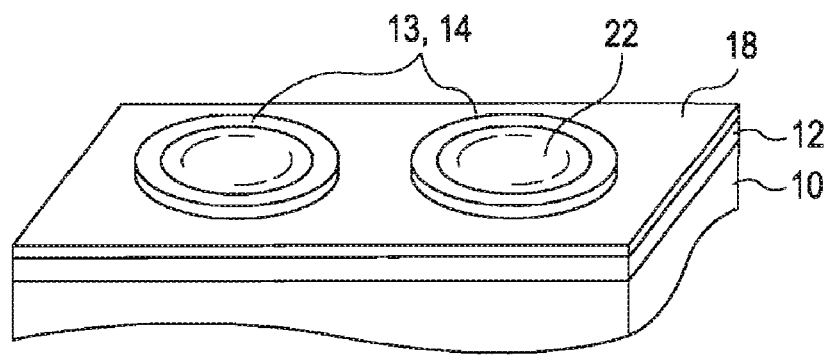

Next, at Step S7, as show in FIGS. 13B and 14D, the hole injection layer 20, an interlayer layer 21 and the light-emitting layer 22 are sequentially formed by an ink jet method in a lower position of each depression corresponding to a pixel aperture 50A formed at Step S6. In more detail, a hole injection material solution is ejected into the depressions by an ink jet method and dried, and thus the hole injection layer 20 is formed. Since the lyophilic layer 12 is exposed at an inner surface of the pixel apertures 50A, it is easy for the hole injection material solution to permeate into and spread over the entire surface of the pixel apertures 50A. As a result, production of defectives in the hole injection layer 20 is decreased. After that, a light-emitting material solution, such as an organic solution is ejected into the depressions by an ink jet method and dried. The ejection and drying of a material solution are repeatedly performed, so that the interlayer layer 21 and the light-emitting layer 22 are sequentially formed.

Next, at Step S8, as shows in FIG. 13C, calcium and aluminum are sequentially stacked on almost the entire surface of the substrate 10 having the light-emitting layer 22 thereon and thus a negative electrode 30 is formed.

Next, at Step S9, an inorganic material, such as a silicon oxide, a silicon nitride or a silicon oxynitride is deposited on the negative electrode 30 in order to form a sealing layer (not shown; so as to cover the entire surface of the substrate 10. The sealing is not limited to a thin film sealing structure using the sealing layer but alternatively a can sealing structure in which a glass substrate is bonded to an object to be protected with an adhesive therebetween.

Through the above steps, the optical head 1D is completed. According to the manufacturing method described above, since the lyophobic material solution 13L is ejected on only the ring-shaped regions 8 when forming the lyophobic layer 13, usage of the lyophobic material solution 13L can be reduced. Further; the lyophobic layer 13 is formed by an ink jet method, a series of troublesome processes for photolithography can be omitted, resulting reduction of manufacturing cost and amount of waste water. Accordingly, the manufacturing method has an advantage of reducing environment pollution. At Step S3, it is possible to remove the lyophilic thin film 18 and arbitrarily set regions on which the lyophilic layer 12 is present by controlling regions to be irradiated by ultraviolet rays. Accordingly, it is possible to form the lyophobic layer 13 at arbitrary regions.

Further, since the hole injection layer 20, the interlayer layer 21 and the light-emitting layer 22 are formed only in the depressions in which the lyophobic layer 13 serves as a side wall and then the negative electrode 30 is formed, it is possible to decrease a contact area between the lower surface of the negative electrode 30 and the lyophobic layer 13 which is apt to absorb moisture. As a result, oxidation of the negative electrode 30 is suppressed and the sealing layer can be easily formed in the case of using the thin film sealing structure. Further, since it is possible to reduce usage of an organic material used for forming the lyophobic layer 13, lifespan of the electro-optical device can be prolonged.

Modification to the Embodiments

In the second embodiment, first the lyophobic thin film 18 is formed on the lyophilic layer 12, next part of the lyophilic thin film 18 is removed by irradiation of ultraviolet rays, and finally the surface of the substrate 10 comes to have lyophobic regions and lyophilic regions by exposing the lyophilic layer 12. However, alternatively the optical head may be manufactured by the following method.

That is, first, the lyophobic thin film 18 made of a lyophobic resin is formed on the lyophilic layer 12. The lyophobic thin film 18 can be formed by a dip coating method, and a material used in this method is a liquid material containing acryl resin or polyimide. Next, a mask is formed on the lyophobic thin film 18 so as to uncover the ring-shaped regions 8 but cover the other regions, and then the entire surface of the substrate is subject to oxygen plasma treatment. That is, the lyophobic thin film 18 only at the ring-shaped regions 8 is treated by oxygen plasma. As a result, the ring-shaped regions 8 are imparted with lyophilicity and the other regions maintain its lyophobicity.

After that, as in the above embodiment, the lyophobic material solution 13L containing a material for the lyophobic layer 13 is ejected on the ring-shaped regions having lyophilicity by an ink jet method. At this time, the ring-shaped regions 8 to which the lyophobic material solution 13L is erected is covered with the lyophobic thin film 1 to which lyophilicity is imparted and the other regions are covered with the lyophobic thin film 18. Accordingly, the lyophobic material solution 13L permeates into the ring-shaped regions 8 but negligibly intrude into other regions. After that, the lyophobic material solution 13L is dried. As described above, according to the modification of the embodiment, the lyophobic layer 13 can be easily formed on the ring-shaped regions 8 by an ink jet method.

Third Embodiment

Figure 6:
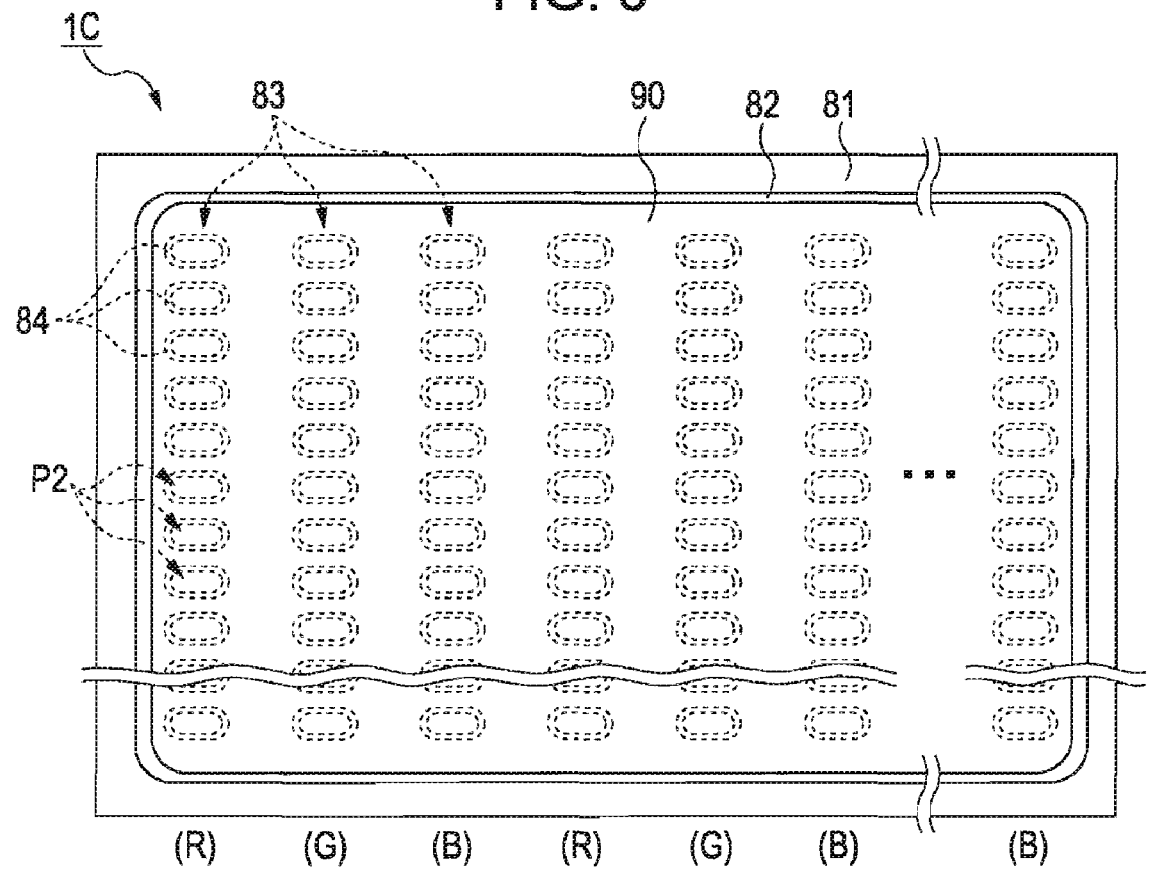
FIG. 6 is a plan view illustrating a display device 1C according to a third embodiment.

FIG. 6 shows an electro-optical device according to a third embodiment of the invention. The electro-optical device according to the third embodiment is a display device 1C with a RGB stripe arrangement. For example, the electro-optical device is a 40-inch display and includes 1920×RGB×1080 pixels (light-emitting element P2) arranged on a substrate 81. The display device 1C has the same structure as the optical head 1A. That is, a lyophilic layer 82 is formed on the substrate 8L, a lyophobic layer 83 including a plurality of lyophobic portions 84 provided in the same number as that of the light-emitting elements P2 is formed on the lyophilic layer 82, the lyophilic layer 82 and the lyophobic layer 83 serve as a bank structure, and inside each pixel aperture defined by a positive electrode (pixel electrodes of each light-emitting element P2 and the bank structure is provided with a hole injection layer, an interlayer layer, a light-emitting layer in this order from a positive electrode side. Further, a common electrode (negative electrode 90) is formed so as to cover the entire light-emitting layer, and a sealing layer covers the common electrode and the bank structure.

However, in the display device 1C, sizes of pixels are different for each other for colors in order to meet requirements, such as brightness and lifespan. Accordingly, shapes of apertures formed in the lyophilic layer 82 and shapes of apertures formed in the lyophobic layer 83 (each lyophobic portion 84, are different for colors. For example, the lyophilic layer 82 and the lyophobic layer 83 (each lyophobic portion 84) are formed so as to have relatively small apertures corresponding to pixel apertures having a relatively small diameter and relatively large apertures corresponding to pixel apertures having a relatively large diameter. A method of manufacturing the display device 1C is the same as the manufacturing method of the optical head 1A except in that light-emitting layers are coated by one color by one color.

According to the display device 1C, it is possible to obtain the same advantage as the optical head 1A. Further, since it is possible to perform light emission with an ideal pixel aperture, resolution of a display image can be enhanced. In the display device 1C, a diameter of a pixel aperture (apertures of lyophobic layer and lyophilic layer, corresponding to a pixel with a small pixel aperture diameter is relatively small.

Accordingly, the volume of the lyophobic layer 83 defining the pixel aperture is decreased and thus an area of the upper surface of the lyophobic layer 83 is small too. Thanks to such a structure, oxidation of the negative electrode is suppressed and a sealing layer in a thin film sealing structure can be easily formed. This embodiment can be modified in a manner such that pixels are arranged in a delta arrangement. Further, this embodiment can be modified in a manner of modification of the first embodiment.

OTHER EXAMPLES OF MODIFICATION (1) Each embodiment may be modified in a manner that the interlayer layer is not provided between the hole injection layer and the light-emitting layer, or alternatively a negative electrode, an electron injection layer for transporting electrons, a light-emitting layer, and a positive electrode are sequentially formed in order to constitute the light-emitting element. In this case, a material solution for the electron injection layer is a water-based solution, so that it is possible to make the material solution to permeate into the inner surface of the pixel aperture. However, materials for the layers formed in the pixel aperture are selected so that they can be formed by a selected coating method (for example, ink jet method).

Figure 7:
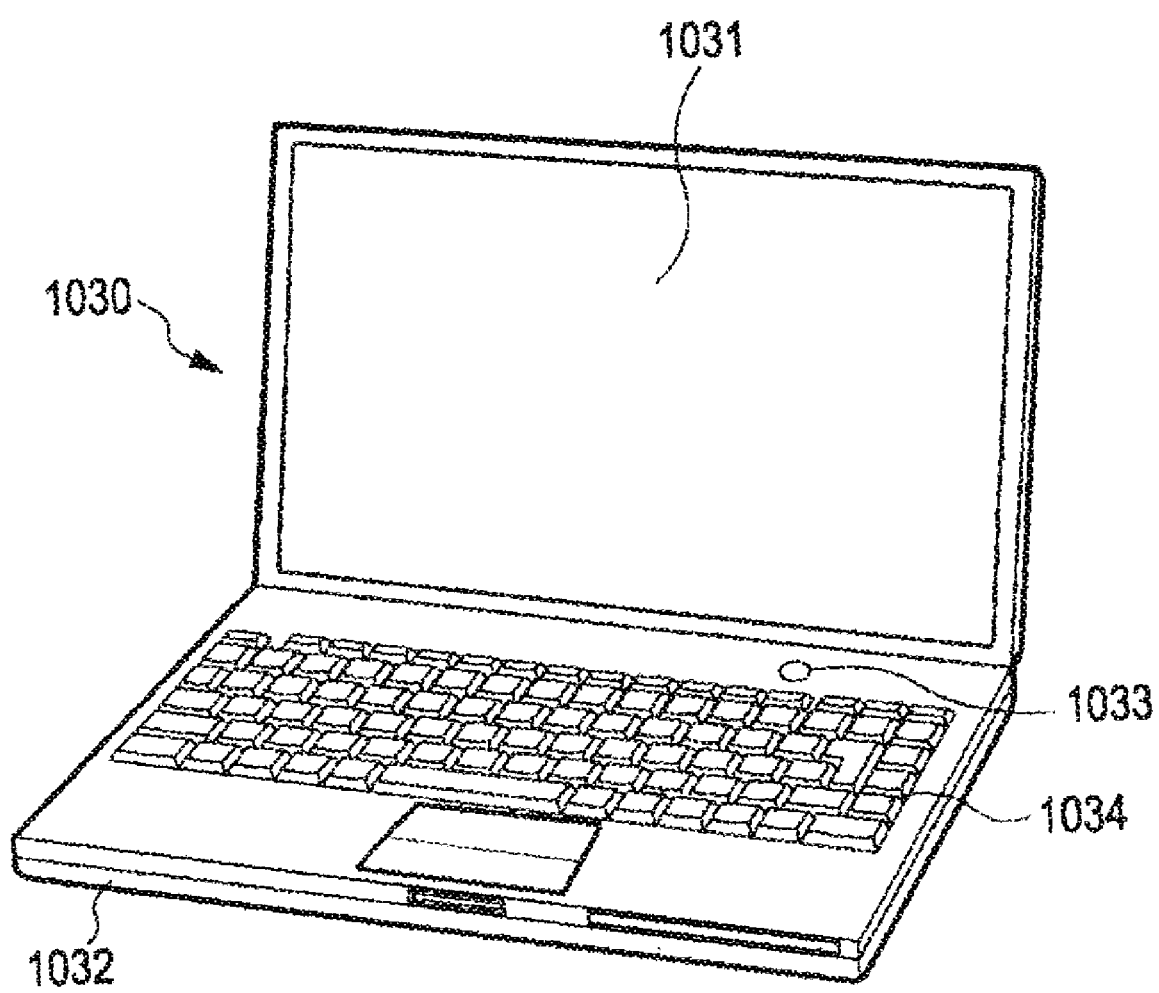
FIG. 7 is a perspective view illustrating a personal computer which is an example of electronic apparatuses, to which the display device 1C is applied.
Figure 8:
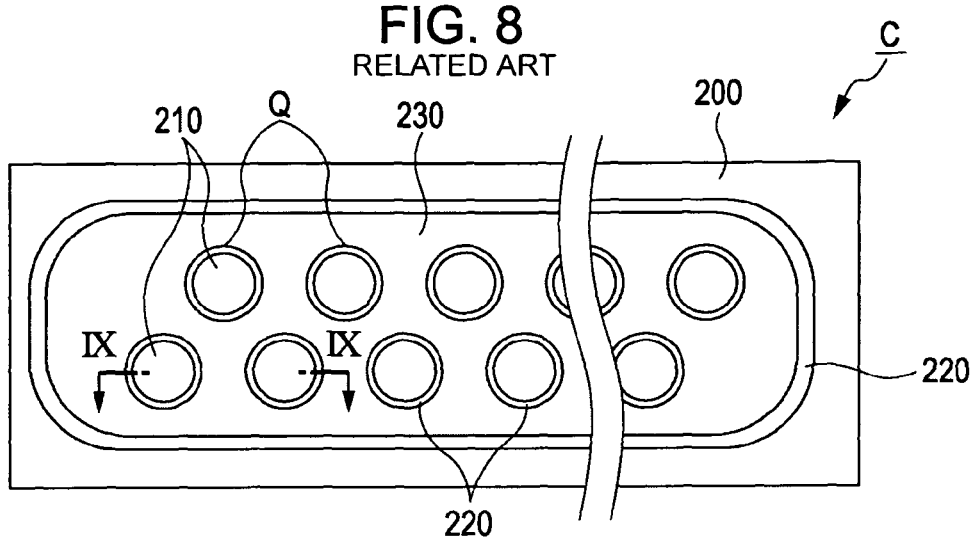
FIG. 8 is a plan view illustrating part of a known organic EL panel.
Figure 9:
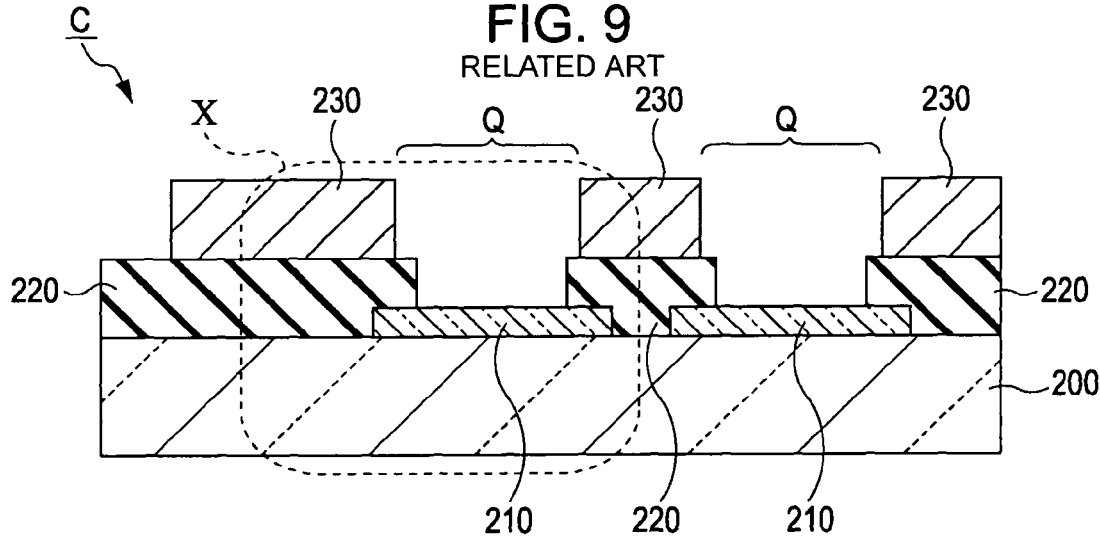
FIG. 9 is a sectional view illustrating the organic EL panel C shown in FIG. 8, which is taken along line Z2-Z2'.
Figure 10:
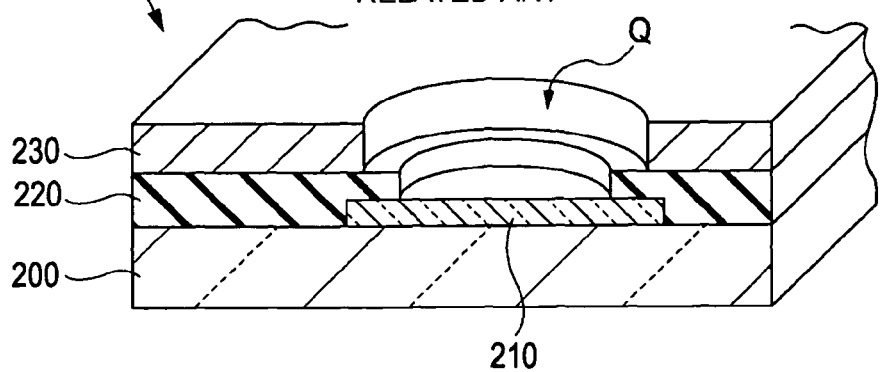
FIG. 10 is a perspective sectional views illustrating part N of the organic EL panel C shown in FIG. 9.

(2) FIG. 7 shows a structure of a personal computer which is an exemplary electronic apparatus using the display device 1C. A personal computer 1030 includes a display portion 1031 serving as a display unit and a body portion 1032. The body portion 1032 is provided with a power switch 1033 and a keyboard 1034. The electronic apparatuses according to the invention further include an electrophotographic Image forming apparatus.

The entire disclosure of Japanese Patent Application Nos. 2006249409, filed Sep. 14, 2006 and 2006-307543, filed Nov. 14, 2006 are expressly incorporated by reference herein.

What is claimed is:

1. An electro-optical device, comprising:
a substrate having a plurality of pixel electrodes thereon;
a bank structure formed on the substrate and provided with a plurality of pixel apertures corresponding to the plurality of pixel electrodes;
an injection layer formed in each of the plurality of pixel apertures for injecting electrons or holes;
an organic semiconductor layer formed on the injection layer in each of the plurality of pixel apertures; and
an electrode formed on the organic semiconductor layer, wherein
the bank structure includes a lyophilic layer formed on the substrate and a lyophobic layer formed on the lyophilic layer, wherein each of the plurality of pixel apertures is formed so as to penetrate the lyophilic layer and the lyophobic layer, and comprises a first aperture in the lyophilic layer and a second aperture in the lyophobic layer corresponding to the first aperture in the lyophilic layer, wherein the first and corresponding second apertures are cylindrical with a same diameter and a same central axis as each other, such that in each of the plurality of pixel apertures, an inner circumferential surface of the lyophilic layer and an inner circumferential surface of the lyophobic layer are in a same plane,
the lyophobic layer has relatively weak affinity for a material solution used for forming the injection layer in comparison with the lyophilic layer and includes a plurality of lyophobic portions corresponding to the plurality of pixel apertures, and the plurality of lyophobic portions are provided so as to be separate from each other such that each of the lyophobic portions is separate from lyophobic portions corresponding to apertures of adjacent pixels, and each of the plurality of the lyophobic portions surrounds the corresponding pixel aperture of the plurality of pixel apertures.

2. The electro-optical device according to claim 1, wherein the lyophilic layer is made of an inorganic material.

3. The electro-optical device according to claim 1, wherein the lyophobic layer is made of an organic material.

4. An electronic apparatus including the electro-optical device according to claim 1.

5. A method of manufacturing an electro-optical device including a plurality of pixel apertures, comprising:
   forming pixel electrodes on a substrate at regions corresponding to the plurality of pixel apertures;
   sequentially stacking a lyophilic layer and a lyophobic thin film on the substrate so as to cover the pixel electrodes;
   processing a surface of the substrate by applying energy to the surface of the lyophobic thin film in order to improve solution affinity of ring-shaped regions of the surface of the lyophobic thin film to be stronger than that of regions other than the ring-shaped regions;
   forming a ring-shaped lyophobic layer by a liquid droplet ejecting method on the ring-shaped regions of the surface of the substrate;
   removing the lyophobic thin film and the lyophilic layer formed at regions surrounded by the ring-shaped regions;
   sequentially forming an injection layer and an organic semiconductor layer in depressions surrounded by the ring-shaped regions by a liquid droplet ejecting method; and
   forming a negative electrode on the organic semiconductor layer.

6. The method according to claim 5, wherein the lyophobic thin film is a monomolecular film, and wherein the processing the substrate includes:
   arranging a mask on the monomolecular film so as to cover regions other than the ring-shaped regions; and
   removing the monomolecular film formed at the ring-shaped regions by irradiating ultraviolet rays on the surface of the substrate.

7. The method according to claim 5, wherein the processing the surface includes:
   arranging a mask on the lyophobic thin film so as to cover regions other than the ring-shaped regions; and
   treating the surface of the substrate with plasma.

* * * * *